(12) United States Patent
Behzad et al.

(10) Patent No.: US 7,616,938 B2
(45) Date of Patent: Nov. 10, 2009

(54) MIXER OFFSET CANCELLATION WITHOUT GENERATING I/Q IMBALANCE

(75) Inventors: Arya Behzad, Poway, CA (US); C. Paul Lee, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 572 days.

(21) Appl. No.: 11/167,528

(22) Filed: Jun. 27, 2005

(65) Prior Publication Data

US 2006/0057999 A1 Mar. 16, 2006

Related U.S. Application Data

(60) Provisional application No. 60/609,193, filed on Sep. 10, 2004.

(51) Int. Cl.
*H04B 1/26* (2006.01)
(52) U.S. Cl. ............... 455/323; 455/205; 455/280; 455/326
(58) Field of Classification Search ........... 455/110, 455/111, 112, 113, 114.2, 205, 280, 293, 455/326
See application file for complete search history.

(56) References Cited

U.S. PATENT DOCUMENTS

| | | | | | |
|---|---|---|---|---|---|
| 6,140,845 | A | * | 10/2000 | Benachour | 327/57 |
| 7,012,457 | B2 | * | 3/2006 | Moran et al. | 327/359 |
| 7,085,549 | B2 | * | 8/2006 | Peterson et al. | 455/323 |
| 2003/0157902 | A1 | * | 8/2003 | Khorram | 455/85 |
| 2003/0157917 | A1 | * | 8/2003 | Khorram | 455/326 |
| 2005/0141634 | A1 | * | 6/2005 | Lin | 375/295 |

\* cited by examiner

*Primary Examiner*—Nguyen Vo
*Assistant Examiner*—Christian A Hannon
(74) *Attorney, Agent, or Firm*—Garlick Harrison & Markison

(57) ABSTRACT

An offset cancellation scheme in which offset cancellation current is sourced into one differential branch of a driver circuit and sinked from the opposite differential branch. The source/sink arrangement allows for offset cancellation current to be introduced into the circuit, but the overall total average current remains substantially unchanged. When used in an I and Q mixer circuits, the offsets may be canceled without generating an I/Q imbalance in the I and Q mixers.

17 Claims, 6 Drawing Sheets

MIXER OFFSET CANCELLATION WITHOUT GENERATING I/Q IMBALANCE

CROSS REFERENCE TO RELATED APPLICATION

This application claims the benefit of priority to U.S. Provisional Patent Application Ser. No. 60/609,193; filed Sep. 10, 2004; and titled "Mixer Offset Cancellation Without Generating I/Q Imbalance," which is incorporated herein by reference.

BACKGROUND OF THE INVENTION

1. Technical Field of the Invention

The embodiments of the invention relate to communication devices and more particularly to an offset cancellation scheme for a mixer.

2. Description of Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage (baseband process) converts between data and baseband signals in accordance with the particular wireless communication standard. The RF stage (transmitter section and receiver section) converts between baseband signals and RF signals. The RF stage may be a direct conversion transceiver that converts directly between baseband and RF or may include one or more intermediate frequency stages.

In some signal processing techniques employed for wireless communication, a modulation (and/or demodulation) stage processes the in-phase (I) component and the quadrature (Q) component of the complex modulation envelope separately. For example, since the I and Q components have a phase difference, an up-conversion module in a signal transmitter path may utilize one mixer to mix the signal with an in-phase local oscillator signal to generate the I component and utilize a second mixer to mix the signal with a phase-shifted local oscillator signal to generate the Q component.

A common type of mixer utilized in communication is a Gilbert cell mixer. A typical mixer stage, including a Gilbert cell mixer, is driven by a transconductance stage, in which input signal voltage is converted to signal current to drive the mixer. The transconductance stage may have gain control circuitry to adjust the gain of the drive current to the mixer. However, in a typical operation a transconductance stage generally generates some amount of offset, since not all of the transistors in the transconductance stage are matched. This offset may be represented as a small current that adds or subtracts from the signal current and when coupled to the mixer the offset current may cause a local oscillator (LO) feedthrough at the mixer. LO feedthrough is a problem if it exceeds a leakage amount specified by a communication standard or if the feedthrough is sufficient to cause the receiver to not receive the signal properly. The offset may be controlled by determining the amount of the LO feedthrough (LOFT) and introducing a cancellation current at the appropriate location in the transconductance stage. The cancellation current may then cancel the effect of the offset to remove the LOFT.

However, since offsets are the result of unbalanced or unmatched circuit characteristics, the offset values in the I transconductance stage may differ from the offset in the Q transconductance stage. In that event, introducing appropriate LOFT cancellation currents in each of the I and Q stages may remove the offsets, but the difference in the cancellation currents introduced into the I and Q circuitry causes an I and Q imbalance, since the total mixer currents between the I and Q mixers are not equal. Thus, even though offsets are dealt with, an IQ imbalance may result from the offset correction.

Accordingly, it would be advantageous to implement an offset cancellation scheme without generating an I/Q imbalance in the I and Q mixers.

SUMMARY OF THE INVENTION

The present invention is directed to apparatus and methods of operation that are further described in the following Brief Description of the Drawings, the Detailed Description of the Embodiments of the Invention, and the Claims. Other features and advantages related to the embodiments of the present invention will become apparent from the following detailed description of the embodiments of the invention made with reference to the accompanying drawings.

In one embodiment of the invention, a differential driver stage is used to generate a differential drive current to drive a mixer. For example, the mixer may be an in-phase mixer (or alternatively a quadrature mixer) used to mix signals for a communication device. An offset cancellation circuit is coupled to the driver stage in which an offset cancellation current is sourced into one branch of the differential drive current and sinked from an opposite branch of the differential current to cancel an offset current coupled to the mixer. Although a cancellation current is introduced into the driver circuit, the total average value of the drive current remains substantially unchanged, due to the sinking of current in the other differential branch. When employed in either or both of the I and Q mixers, offsets may be canceled without generating an I/Q imbalance.

When two mixers are employed as I and Q mixers in a communication signal path, the source/sink combination of the offset cancellation current may be employed in either one or both of the mixers. Furthermore, the source/sink arrangement may be employed in branches of a driver circuit for one mixer or both mixers.

DETAILED DESCRIPTION OF THE EMBODIMENTS OF THE INVENTION

The embodiments of the present invention may be practiced in a variety of settings that implement a mixer in a communication device.

Figure 1:
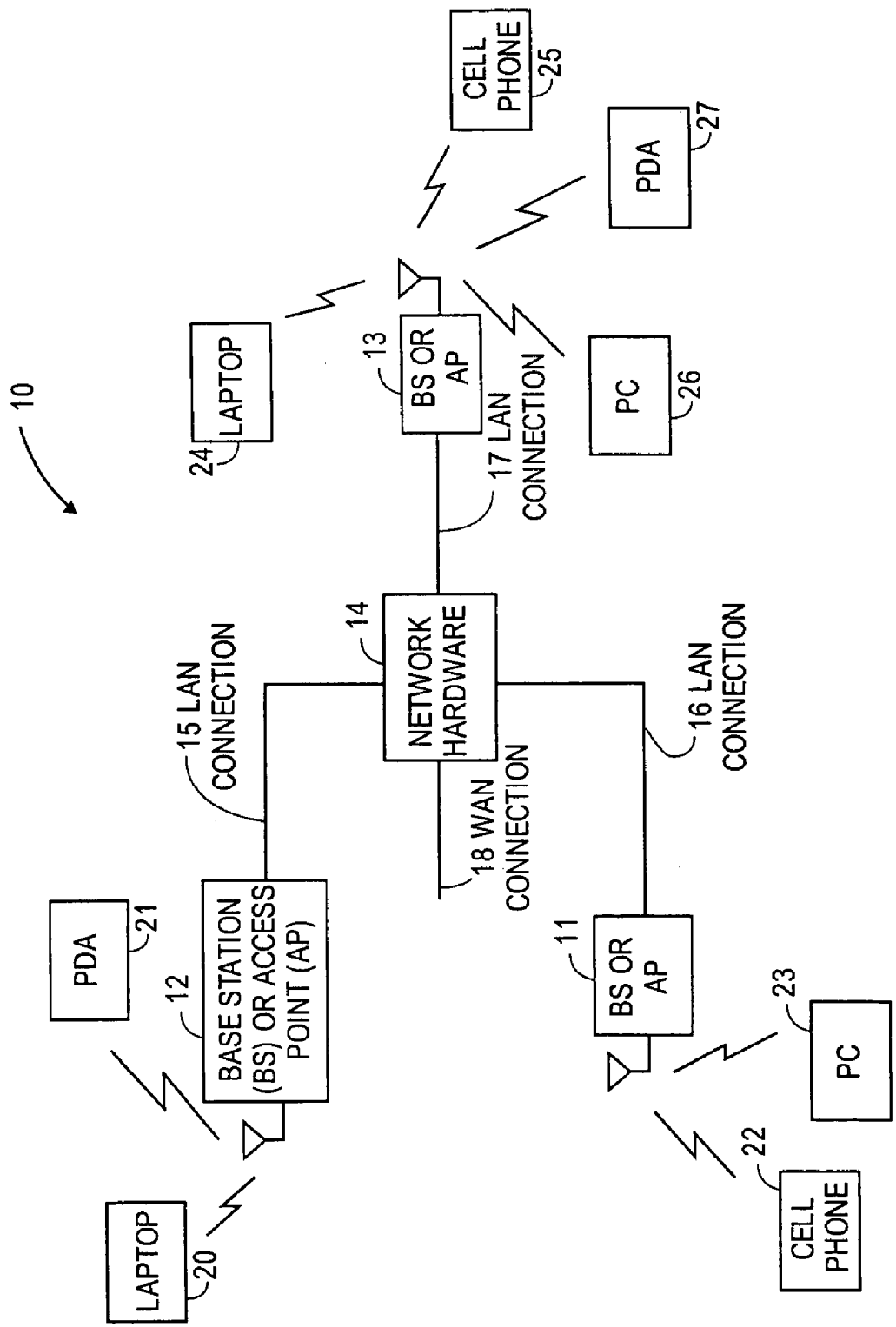
FIG. 1 is a block schematic diagram illustrating a wireless communication system in accordance with one embodiment of the present invention.

FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20 and 24, personal digital assistant hosts 21 and 27, personal computer hosts 23 and 26, cellular telephone hosts 22 and 25, and/or any other type of device that supports wireless communications. The details of the wireless communication devices will be described with reference to FIG. 2.

Base stations or access points 11-13 may be operably coupled to network hardware 14 via respective local area network (LAN) connections 15-17. Network hardware 14, which may be a router, switch, bridge, modem, system controller, et cetera, may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers to enhance performance, reduce costs, reduce size, and/or enhance broadband applications.

Figure 2:
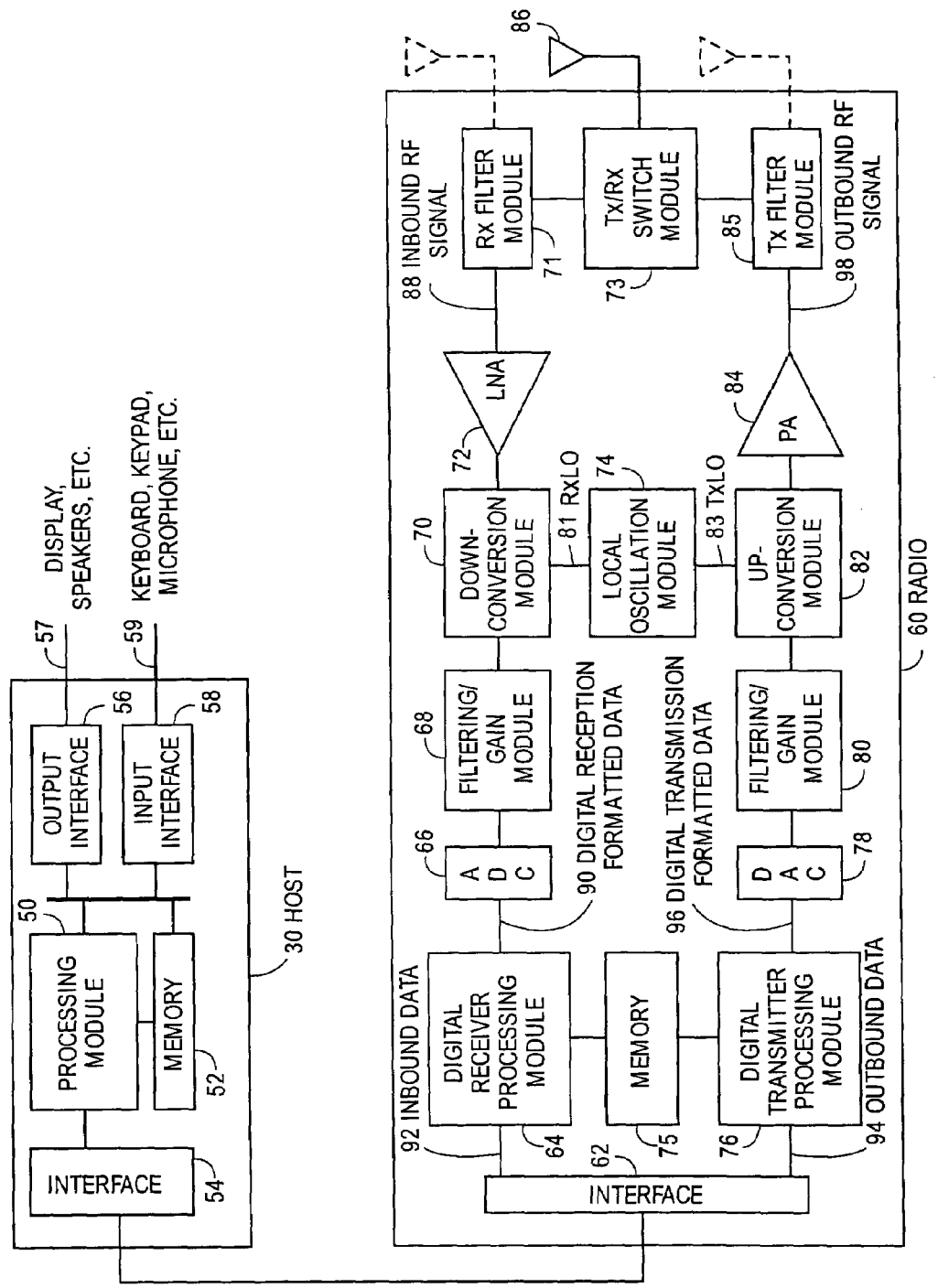
FIG. 2 is a schematic block diagram illustrating a wireless communication device in accordance with one embodiment of the present invention.

FIG. 2 is a schematic block diagram illustrating a wireless communication device that includes a host unit 30 and an associated radio unit 60. Host unit 30 may be incorporated in a communication device, such as one or more of the wireless communication devices 20-27 shown in FIG. 1. For cellular telephone hosts, radio 60 is typically a built-in component. For personal digital assistants hosts, laptop hosts, and/or personal computer hosts, radio 60 may be built-in or may be an externally coupled component that couples to host device 30 via a communication link, such as a PCI interface, PCMCIA interface, USB interface, or another type of interface.

As illustrated, host device 30 includes a processing module 50, memory 52, radio interface 54, input interface 58, and output interface 56. Processing module 50 and memory 52 execute corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For inbound data received from radio 60, radio interface 54 provides the data to processing module 50 for further processing and/or routing to output interface 56. Output interface 56 provides connectivity to an output display device 57, such as a display, monitor, speakers, et cetera, such that the received data may be displayed or otherwise output. Radio interface 54 also provides outbound data from processing module 50 to radio 60. Processing module 50 may receive the outbound data from an input device 59, such as a keyboard, keypad, microphone, et cetera, via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter (ADC) 66, a filtering/gain/attenuation module 68, an intermediate frequency (IF) mixing down conversion stage noted as down-conversion module 70, a receiver filter module 71, a low noise amplifier (LNA) 72, a transmitter/receiver (Tx/Rx) switch module 73, a local oscillation module 74, a memory 75, a digital transmitter processing module 76, a digital-to-analog converter (DAC) 78, a filtering/gain/attenuation module 80, an IF mixing up conversion stage noted as up-conversion module 82, a power amplifier (PA) 84, a transmitter filter module 85, and an antenna 86. The antenna 86 may be a single antenna that is shared by the transmit and receive paths as controlled by Tx/Rx switch 73, or may include separate antennae for the transmit path and receive path (shown by the dotted line). The antenna implementation may depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. Digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry. Memory 75 stores, and the processing module 64 and/or 76 executes, operational instructions that facilitate functionality of the device. In some embodiments, the combination of digital receiver processing module 64, digital transmitter processing module 76 and memory 75 may be referred to together as a "baseband processor."

In operation, radio 60 receives outbound data 94 from host 30 via host interface 62. Host interface 62 routes outbound data 94 to digital transmitter processing module 76, which processes outbound data 94 in accordance with a particular wireless communication standard (e.g., IEEE802.11a, IEEE802.11b, IEEE802.11g, Bluetooth, et cetera) to produce digital transmission formatted data 96. Digital transmission formatted data 96 is typically a digital base-band signal or a digital low IF signal, where the low IF typically may be in the frequency range of one hundred kilohertz to a few megahertz (MHz).

Digital-to-analog converter 78 converts digital transmission formatted data 96 from the digital domain to the analog domain. Filtering/gain/attenuation module 80 filters and/or adjusts the gain of the analog signal prior to providing it to up-conversion module 82 for mixing. Up-conversion module 82 directly converts the analog baseband or low IF signal into an RF signal based on a transmitter local oscillation (Tx LO) 83 provided by local oscillation module 74. Power amplifier 84 amplifies the RF signal to produce outbound RF signal 98, which is filtered by transmitter filter module 85. Antenna 86 propagates outbound RF signal 98 to a targeted device such as a base station, an access point and/or another wireless communication device.

Radio 60 also receives inbound RF signal 88 via antenna 86, which was transmitted by a base station, an access point, or another wireless communication device. Antenna 86 provides inbound RF signal 88 to receiver filter module 71 via Tx/Rx switch 73, where Rx filter 71 bandpass filters inbound RF signal 88. Rx filter 71 provides the filtered RF signal to low noise amplifier 72, which amplifies signal 88 to produce an amplified inbound RF signal. The low noise amplifier 72 provides the amplified inbound RF signal to down-conversion module 70, which directly converts the amplified inbound RF signal into an inbound low IF signal or baseband signal based on a receiver local oscillation (Rx LO) 81 provided by local oscillation module 74. Down-conversion module 70 provides the inbound low IF signal or baseband signal to filtering/gain/attenuation module 68. Filtering/gain/attenuation module 68 may be implemented to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to host device 30 via radio interface 54.

As one of ordinary skill in the art will appreciate, the particular wireless communication device of FIG. 2 may be implemented using one or more integrated circuits. For example, host 30 may be implemented on one integrated circuit and digital receiver processing module 64, digital transmitter processing module 76 and memory 75 may be implemented on a second integrated circuit, and the remaining components of radio 60, less the antenna 86, may be implemented on a third integrated circuit. As an alternative embodiment, radio 60 may be implemented on a single integrated circuit. As yet another alternative embodiment, processing module 50 of host 30 and digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and digital receiver and transmitter processing module 64 and 76.

Furthermore, it is to be noted that although a single signal path is noted for each of the transmitter and receiver paths, a typical practice is to have a separate signal path for the in-phase (I) component and the quadrature (Q) component. Thus, one or both of the conversion modules 70, 82 may implement a in-phase mixer to mix an incoming signal with an in-phase LO signal and a quadrature mixer to mix an incoming signal with a phase-shifted LO signal. Also, for many applications, the signal path may be differential, instead of single-ended, so that a differential transistor pairs are utilized to provide a positive (+) branch (or leg) of the differential path and a corresponding negative (−) branch (or leg) of the differential path.

Figure 3:
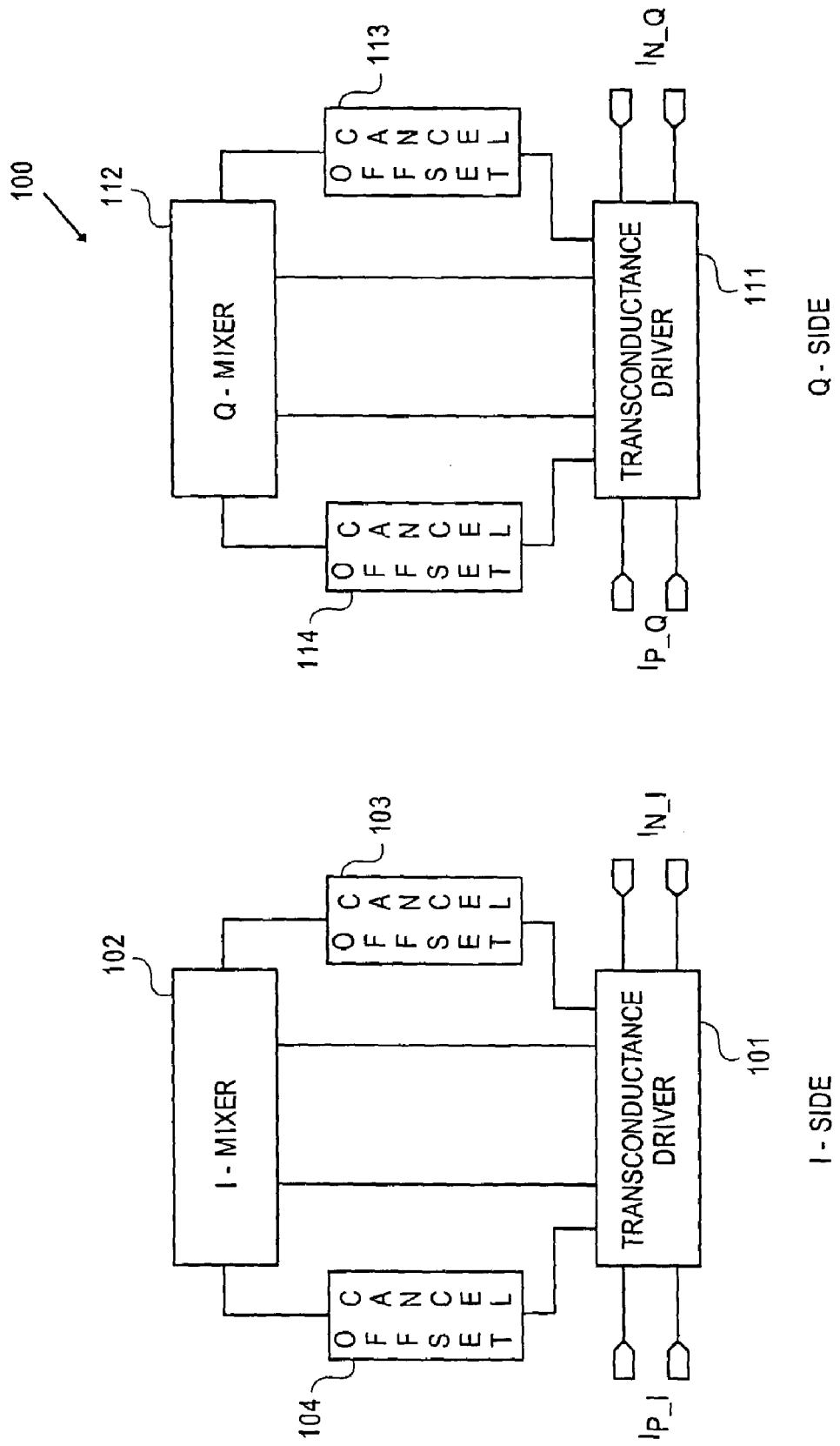
FIG. 3 is a block schematic diagram illustrating one embodiment of a conversion stage that implements separate I and Q mixers with offset cancellation coupled back to the transconductance drivers.

FIG. 3 shows one embodiment of a circuit for practicing the present invention. FIG. 3 shows a circuit 100 that includes an in-phase mixer (I-mixer) 102 and a quadrature mixer (Q-mixer) 112. The in-phase portion of circuit 100 is noted as I-side and the quadrature portion is noted as Q-side. The I-side of circuit 100 includes a transconductance driver stage 101, which is used to drive mixer 102. Although a variety of different driver stages may be employed to drive mixer 102, in the particular example of FIG. 3, transconductance driver 101 is employed to provide a drive current to drive mixer 102. Transconductance drivers are commonly used as drivers for mixers. For example, a Gilbert cell mixer is driven by a transconductance stage, in which an input signal voltage is converted to signal current to drive the mixer. Thus, in one embodiment, transconductance driver 101 and mixer 102 form a Gilbert cell mixer stage for the I-side of the signal path.

In one embodiment of the invention, transconductance driver 101 is a differential circuit that receives a differential signal input $I_{P\_I}$ (+ input for I-side) and $I_{N\_I}$ (− input for I-side) and converts the voltage inputs to current to generate the drive current for mixer 102. Transconductance driver 101 may include a gain control circuitry to adjust the gain of the drive current to the mixer. Only one pair of inputs are shown in FIG. 3, but it is appreciated that the LO signal is also coupled to the mixer and such coupling may be through transconductance driver stage 101 or a separate transconductance stage equivalent to the coupling of the signal $I_{P\_I}$ and $I_{N\_I}$. For example, if mixer 102 is in a transmit path, such as in up-conversion module 82 of FIG. 2, mixer 102 may combine a modulation signal with a local oscillator (LO) to generate an I component of a modulated radio frequency (RF) signal.

In many applications, transconductance driver 102 generates an offset current. The offset is generated from various combination of factors, but one primary cause is due to mismatched $V_T$ of transistors in the transconductance circuit. The offset is a DC component that adds/subtracts from the drive current. The offset may have significant impact on LO feedthrough and is a problem if it exceeds a leakage amount specified by a communication standard or if the feedthrough is sufficient to cause the receiver to not receive the signal properly.

Accordingly, an offset compensation or cancellation scheme is employed to cancel, or at least to significantly reduce the effects of the offset. In the illustrated embodiment of FIG. 3, an offset cancellation circuit is employed to provide an offset cancellation current in each branch of the transconductance driver 101. That is, offset cancellation circuits 103, 104 provide offset cancellation current to transconductance driver 101. It is noted that although two circuits 103, 104 are shown in the example, the actual number of such cancellation circuits may vary. The two circuits may be combined into one. Two offset cancellation circuits are shown in FIG. 3 to illustrate that cancellation current may be provided to both sides of the differential branch.

Furthermore, it is to be noted that a variety of techniques, including known techniques, may be used to determine the offset in mixer 102. For example, LOFT may be determined in the mixer and cancellation current may be adjusted in one branch to reduce the LOFT. Incremental adjustments may be performed until the offset is at an acceptable value. Other techniques may be employed as well. What is to be noted is that the detection of undesirable LOFT may be cancelled by use of offset cancellation circuits 103, 104.

The Q-side of the circuit 100 includes mixer 112, transconductance driver 111, offset cancellation circuits 113 and 114, all of which operate equivalently to corresponding units 101-104, but now for generating the Q-component output from the mixer. Transconductance driver 111 receives inputs $I_{P\_Q}$ (+ input for Q-side) and $I_{N\_Q}$ (− input for Q-side) for generating drive currents to mixer 112. Cancellation circuits 113, 114 now attempt to cancel effects of offsets in Q-mixer 112.

Figure 4:
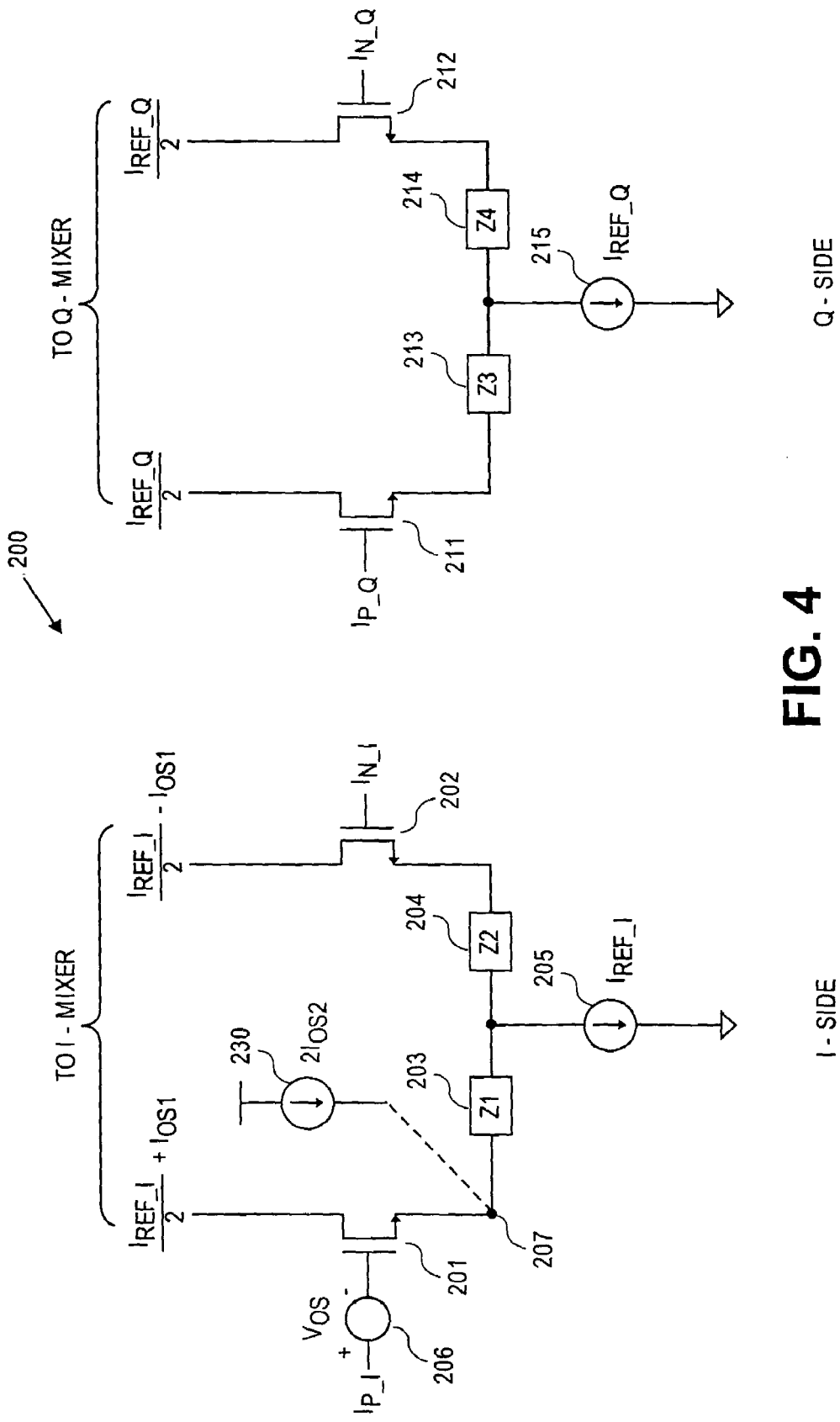
FIG. 4 is a circuit schematic diagram of one embodiment of a differential transconductance stage for the I-mixer and a similar transconductance drive stage for the Q-mixer, and in which an example offset is shown generated at the positive input of the I-side driver stage.

FIG. 4 shows one embodiment for implementing a transconductance driver stage for I and Q mixers. A circuit 200 employs differentially arranged transistors 201, 202 on the I-side of the circuit. Signal $I_{P\_I}$ is coupled to the gate of transistor 201, while signal $I_{N\_I}$ is coupled to the gate of transistor 202, and the voltage inputs are converted to signal current. Impedances 203, 204 represent impedance values Z1 and Z2 in the respective differential branches of the I-side driver. In the particular example, total average drive current to the I-mixer is noted as $I_{REF\_I}$ and represented by current source 205. $I_{REF\_I}$ is split as current $\frac{1}{2}I_{REF\_I}$ to each of the branches.

The Q-side of the circuit has equivalent arrangement with transistors 211, 212 and impedances 213, 214, representing impedance values Z3 and Z4. Signals $I_{P\_Q}$ and $I_{N\_Q}$ are respectively input at the gates of transistors 211, 212. The total average current is $I_{REF\_Q}$ and represented by current source 215. The current $I_{REF\_Q}$ is split so each branch of the Q-side is driven by $\frac{1}{2}I_{REF\_Q}$. Impedances Z1-Z4 are generally equal, but need not be. Furthermore, circuit 200 represents a simple circuit equivalent only and in practice, many more components may be utilized to design the transconductance drivers for I and Q mixers.

In a desirable operation, there would be no offsets, so that average drive current $\frac{1}{2}I_{REF\_I}$ flows in the positive and negative branches of the I-side driver and $\frac{1}{2}I_{REF\_Q}$ flows in each of the branches of the Q-side driver. The total average current for the I-side would be $I_{REF\_I}$ and total average current for the Q-side would be $I_{REF\_Q}$. This ensures that there is no LOFT through the mixers. Furthermore, in a desirable situation $I_{REF\_I}$ would equal $I_{REF\_Q}$, so that there would be no imbalance between the I and Q mixers. Thus, in a desirable situation, both I-side and Q-side drivers would generate no offset currents and have no I/Q imbalance.

However, due to transistor mis-matches and other circuit imbalances, offsets are typically introduced at one or more locations of the transconductance stage. FIG. 4 shows one example of such an offset being introduced into the circuitry. An offset voltage $V_{OS}$, represented by voltage source 206, is introduced at the gate of transistor 201. This offset may be a result of mis-matched gate threshold voltages (Vth) of transistors 201 and 202 or it may come from a previous stage. The offset voltage causes an offset current noted as $I_{OS1}$. Due to the differential configuration, current in one branch is increased by $I_{OS1}$, while current in the other branch is decreased by $I_{OS1}$.

Assuming that no other offsets or imbalances are present in circuit 200, the I-side now has an offset that most likely causes a LOFT in the I-mixer. In order to correct for the offset, an offset cancellation current of $2I_{OS2}$ may be introduced into node 207, as represented by current source 230. As noted above, a LOFT detection mechanism may determine the amount of cancellation current needed. The offset cancellation current $2I_{OS2}$ introduces additional current in the +branch to cause the driver current in the +branch to match the current in the −branch. This removes or reduces the offset between the two branches, resulting in the cancellation or reduction of the offset to the I-mixer. It is to be noted that the cancellation current $2I_{OS2}$ may have the value $2I_{OS1}$, but in most instances, the cancellation current being introduced is not equal to the actual offset current. Accordingly, the value of the cancellation current $2I_{OS2}$ has a value so as to cancel or significantly reduce the offset currents $+I_{OS1}$, and $-I_{OS1}$.

In FIG. 4, the total average current represented by source 205 is no longer $I_{REF\_I}$. Instead it now has a difference of $2I_{OS2}$ with respect to $I_{REF\_I}$. Although the offset condition no longer exists, an I/Q imbalance now exists, due to the unmatched average currents to the I-mixer and Q-mixer.

Figure 5:
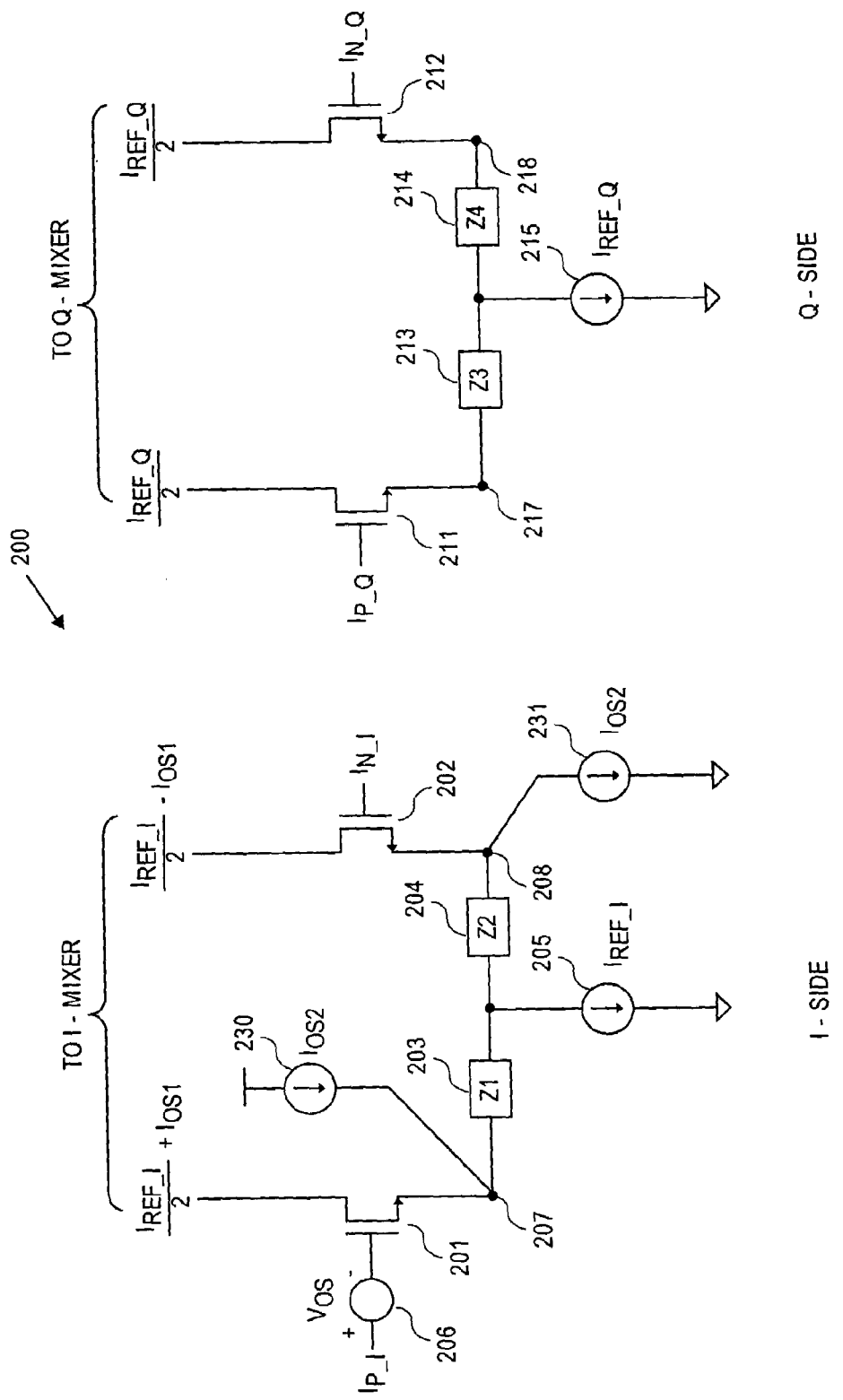
FIG. 5 is a circuit schematic diagram showing the circuit of FIG. 4 in which an embodiment of a source-sink offset current arrangement is employed to cancel the offset, but in which average mixer current is substantially unaffected by the cancellation current, thereby preventing generation of I/Q imbalance between the I and Q mixers.

FIG. 5 illustrates one embodiment of the invention to remove the offset condition without creating an I/Q imbalance. The same circuit 200 with the same offset $V_{OS}$ is used as an example in FIG. 5. In this instance, instead of introducing a cancellation current just into node 207, a source-sink (also referred to as push-pull) scheme is used at nodes 207 and 208.

Thus, in the example embodiment, cancellation current $I_{OS2}$ (shown by source 230) is sourced into node 207, while current $I_{OS2}$ (shown by source 231) is sinked from node 208. The sourcing and sinking of the offset cancellation current at nodes 207, 208 cancel the offset current in each branch. Cancellation current $I_{OS2}$ most likely has a value other than $I_{OS1}$, as was noted above. Additionally, the cancellation current is shown sourced into node 207 and sinked from node 208, but the reverse condition (source into node 208 and sink from node 207) may be applicable if offset is in the opposite direction.

The Q-side circuitry is equivalent to the I-side and functions similarly when offset cancellation is desired. Sourcing and sinking of currents may be implemented at nodes 217, 218 (similar to the I-side), which allows offset currents in the stage to be cancelled, but without causing an I/Q imbalance with the I-mixer. The source-sink arrangement removes the offset condition in the + and − branches. Since whatever current sourced into one node is sinked at the other node, the total average current still remains as $I_{REF\_I}$, thereby not creating an imbalance condition between the I-side and the Q-side. Thus, offset cancellation is achieved without creating an I/Q imbalance between the I-mixer and the Q-mixer, allowing for balanced I and Q signals to be combined in a transmitter.

It is to be noted that the examples illustrated in FIGS. 4 and 5 show a single offset at transistor 201. In actual practice, offset conditions may exist at various locations and multiple offset conditions may also be present. Accordingly, FIG. 6 shows one embodiment of the invention in which almost any offset may be canceled whether in the + or − branch or whether in the I-side or in the Q-side driver.

Figure 6:
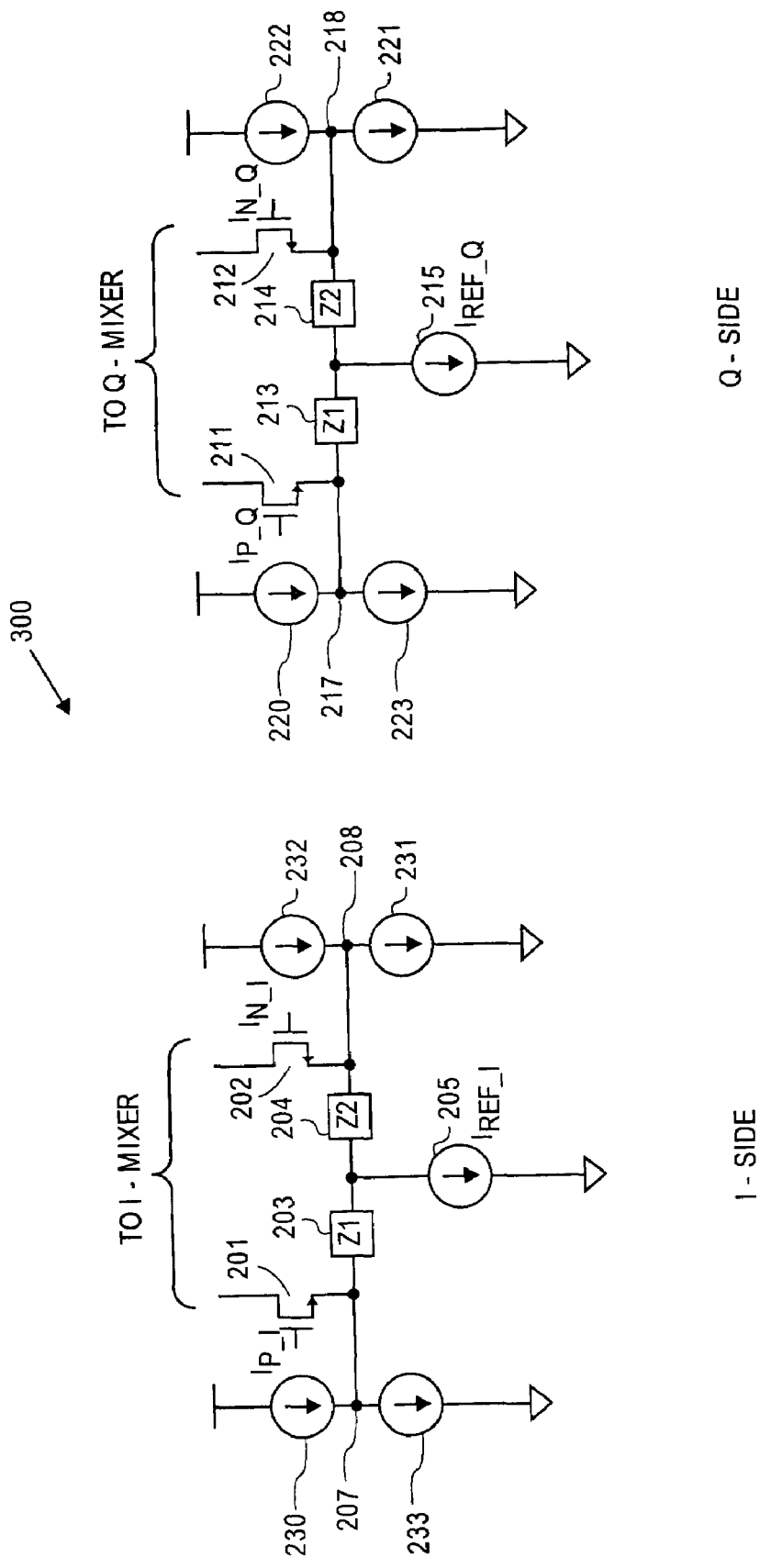
FIG. 6 is a circuit schematic diagram of one embodiment of providing a source/sink offset cancellation network for addressing offsets generated in the I and Q transconductance stages, but in which I/Q imbalance is not generated.

FIG. 6 shows a circuit that duplicates the transistors and impedances of circuit 200. Sourcing and sinking of offset cancellation currents are provided at all four nodes 207, 208, 217, 218 and the cancellation currents are represented by current source/sink pairs 230/231, 232/232, 220/221, 222/223. That is, when a particular offset cancellation current is selected, offset cancellation current is sourced into one differential branch and sinked from the opposite differential branch. For example, for I-side of the driver, source 230 operates in conjunction with sink 231 and source 232 operates with sink 233. Similarly on the Q-side, source 220 operates in conjunction with sink 221 and source 222 operates in conjunction with sink 223. Accordingly, offset cancellation currents are introduced into the drive stage, but the overall average current remains substantially the same, so that I/Q imbalance is avoided to allow for the combining of balanced I and Q signals.

Thus, an offset cancellation for a mixer is achieved without generating an I/Q imbalance. The embodiments of the invention may be employed in various mixer circuits For example, embodiments of the invention may be employed in a mixer that is placed in a transmission path of a radio, such as up-conversion module 82 of FIG. 2 and implemented in a wireless device, such as one or more devices shown in system 10 of FIG. 1. Furthermore, although the embodiments of the invention are described in reference to a mixer, it is to be noted that other embodiments of the invention may be readily applied to other circuitry that implement a dual complementary driver circuit that drive loads other than a mixer.

We claim:

1. An apparatus comprising:
   a mixer;
   a differential driver stage, having a common current split between two branches of the differential driver stage, to generate a differential drive current to drive the mixer, the differential driver stage operating as a transconductance stage of the mixer in which the differential drive current of the differential driver stage provides differential inputs to the mixer; and
   an offset cancellation circuit coupled to the driver stage in which an offset cancellation current is sourced into one branch of the differential drive current in the transconductance stage and respectively sinked from an opposite branch of the differential drive current in the transconductance stage to cancel an offset current between the two branches of the transconductance stage, but in which total average value of the common current remains substantially unchanged due to corresponding sourcing and sinking of the offset cancellation current.

2. The apparatus of claim 1 wherein the mixer is an in-phase (I) mixer to generate an in-phase component of a communication signal and the offset cancellation circuit cancels the offset current to the I mixer without introducing imbalance with a quadrature (Q) mixer that generates a quadrature (Q) component of the communication signal.

3. The apparatus of claim 2 wherein the offset cancellation circuit sources cancellation current into either branch of the differential driver current and sinks from a corresponding opposite branch not used to source the cancellation current.

4. The apparatus of claim 1 wherein the mixer is a quadrature (Q) mixer to generate a quadrature component of a communication signal and the offset cancellation circuit cancels the offset current to the Q mixer without introducing imbalance with an in-phase (I) mixer that generates an in-phase (I) component of the communication signal.

5. The apparatus of claim 4 wherein the offset cancellation circuit sources cancellation current into either branch of the differential driver current and sinks from a corresponding opposite branch not used to source the cancellation current.

6. An apparatus comprising:
   a first mixer;
   a second mixer;
   a first differential driver stage coupled to the first mixer, in which the first differential driver stage has a first common current split between two branches of the first differential driver stage to generate a first differential drive current to drive the first mixer, the first differential driver stage operating as a first transconductance stage of the first mixer in which the first differential drive current of the first differential driver stage provides a first differential input signal to the first mixer;
   a second differential driver stage coupled to the second mixer, in which the second differential driver stage has a second common current split between two branches of the second differential driver stage to generate a second differential drive current to drive the second mixer, the second differential driver stage operating as a second transconductance stage of the second mixer in which the second differential drive current of the second differential driver stage provides a second differential input signal to the second mixer; and
   a first offset cancellation circuit coupled to the first driver stage in which a first offset cancellation current is sourced into one branch of the first differential drive current in the first transconductance stage and respectively sinked from an opposite branch of the first differential drive current in the first transconductance stage to cancel a first offset current between the two branches of the first transconductance stage, but in which total average value of the first common current remains substantially unchanged due to corresponding sourcing and sinking of the first offset cancellation current.

7. The apparatus of claim 6 wherein the first mixer is an in-phase (I) mixer to mix the first differential input signal and an in-phase component of a local oscillator signal to generate an in-phase output component of a communication signal and the first offset cancellation circuit cancels the first offset current in the first differential input signal to the first mixer without introducing imbalance with the second mixer that generates a quadrature (Q) output component of the communication signal by mixing the second differential input signal and a phase-shifted component of the local oscillator signal.

8. The apparatus of claim 6 wherein the first mixer is a quadrature (Q) mixer to mix the first differential input signal and a phase-shifted component of a local oscillator signal to generate a quadrature output component of a communication signal and the first offset cancellation circuit cancels the first offset current in the first differential input signal to the first mixer without introducing imbalance with the second mixer that generates an in-phase (I) output component of the communication signal by mixing the second differential input signal and an in-phase component of the local oscillator signal.

9. The apparatus of claim 6 further comprising a second offset cancellation circuit coupled to the second driver stage in which a second offset cancellation current is sourced into one branch of the second differential drive current in the second transconductance stage and respectively sinked from an opposite branch of the second differential drive current in the second transconductance stage to cancel a second offset current between the two branches of the second transconductance stage, but in which total average value of the second common current remains substantially unchanged due to corresponding sourcing and sinking of the second offset cancellation current.

10. The apparatus of claim 9 wherein one of the first or second mixer is an in-phase mixer and the other of the first or second mixer is a quadrature mixer.

11. The apparatus of claim 9 wherein the first mixer is an in-phase (I) mixer to mix the first differential input signal and an in-phase component of a local oscillator signal to generate an in-phase output component of a communication signal and the first offset cancellation circuit cancels the first offset current in the first differential input signal to the first mixer without introducing imbalance with the second mixer and wherein the second mixer is a quadrature (Q) mixer to mix the second differential input signal and a phase-shifted component of a local oscillator signal to generate a quadrature output component of a communication signal and the second offset cancellation circuit cancels the second offset current in the second differential input signal to the second mixer without introducing imbalance with the first mixer.

12. The apparatus of claim 11 wherein the first offset cancellation circuit sources the first offset cancellation current into either branch of the first differential driver current and sinks from a corresponding opposite branch not used to source the first cancellation current and wherein the second offset cancellation circuit sources the second cancellation current into either branch of the second differential driver current and sinks from a corresponding opposite branch not used to source the second cancellation current.

13. The apparatus of claim 12 wherein the first and second mixers are Gilbert cell mixers.

14. A method comprising:
  driving a differential driver stage, having a common current split between two branches of the differential driver stage, to generate a differential drive current to drive one of a pair of mixers, the differential driver stage operating as a transconductance stage of the one of the pair of mixers in which the differential drive current of the differential driver stage provides differential inputs to the one of the pair of mixers;
  sourcing an offset cancellation current into one branch of the differential drive current in the transconductance stage and respectively sinking from an opposite branch of the differential current in the transconductance stage to cancel an offset current between the two branches of the transconductance stage, but in which total average value of the common current remains substantially unchanged due to corresponding sourcing and sinking of the offset cancellation current.

15. The method of claim 14 wherein driving the driver stage includes driving an in-phase mixer and sourcing and sinking the offset cancellation current cancels the offset current without causing an imbalance with a quadrature mixer.

16. The method of claim 14 wherein driving the driver stage includes driving a quadrature mixer and sourcing and sinking the offset cancellation current cancels the offset current without causing an imbalance with an in-phase mixer.

17. The method of claim 14 wherein driving the driver stage includes driving a Gilbert cell mixer.

* * * * *